United States Patent [19]

Siuta

[11] Patent Number: 4,600,604
[45] Date of Patent: Jul. 15, 1986

[54] METAL OXIDE-COATED COPPER POWDER

[75] Inventor: Vincent P. Siuta, Cherry Hill, N.J.

[73] Assignee: E. I. Du Pont de Nemours and Company, Wilmington, Del.

[21] Appl. No.: 781,724

[22] Filed: Sep. 30, 1985

Related U.S. Application Data

[62] Division of Ser. No. 651,081, Sep. 17, 1984.

[51] Int. Cl.$^4$ ............................................. B05D 7/00
[52] U.S. Cl. ..................................... 427/216; 427/217;
428/403; 252/518; 252/520; 252/521; 252/512;
75/0.5 B
[58] Field of Search ............... 427/216, 217, 226, 229;
428/403; 75/0.5 B, 72; 419/10, 19, 20, 22;
420/469, 492, 498; 252/518, 520, 521, 512

[56] References Cited

U.S. PATENT DOCUMENTS

| | | | |
|---|---|---|---|
| 2,993,815 | 7/1961 | Trepstow | 252/518 |
| 3,988,647 | 10/1976 | Bolon et al. | 317/101 B |
| 4,072,771 | 2/1978 | Grier, Sr. | 427/96 |
| 4,503,090 | 3/1985 | Brown et al. | 252/512 |
| 4,514,321 | 4/1985 | Suita et al. | 252/512 |
| 4,521,329 | 6/1985 | Siuta et al. | 252/512 |

FOREIGN PATENT DOCUMENTS 57-1115  5/1982  Japan .

Primary Examiner—Josephine L. Barr

[57] ABSTRACT

Particles of Cu-containing metal having a particle size of 0.5–20 μm in largest dimension bearing a thin, substantially continuous coating of at least one metal oxide having a free energy of formation more negative than −98 kcal/mole and method of making them. The metal oxide-coated particles have improved sintering and shrinking properties which closely match those of green ceramic tape.

7 Claims, 4 Drawing Figures

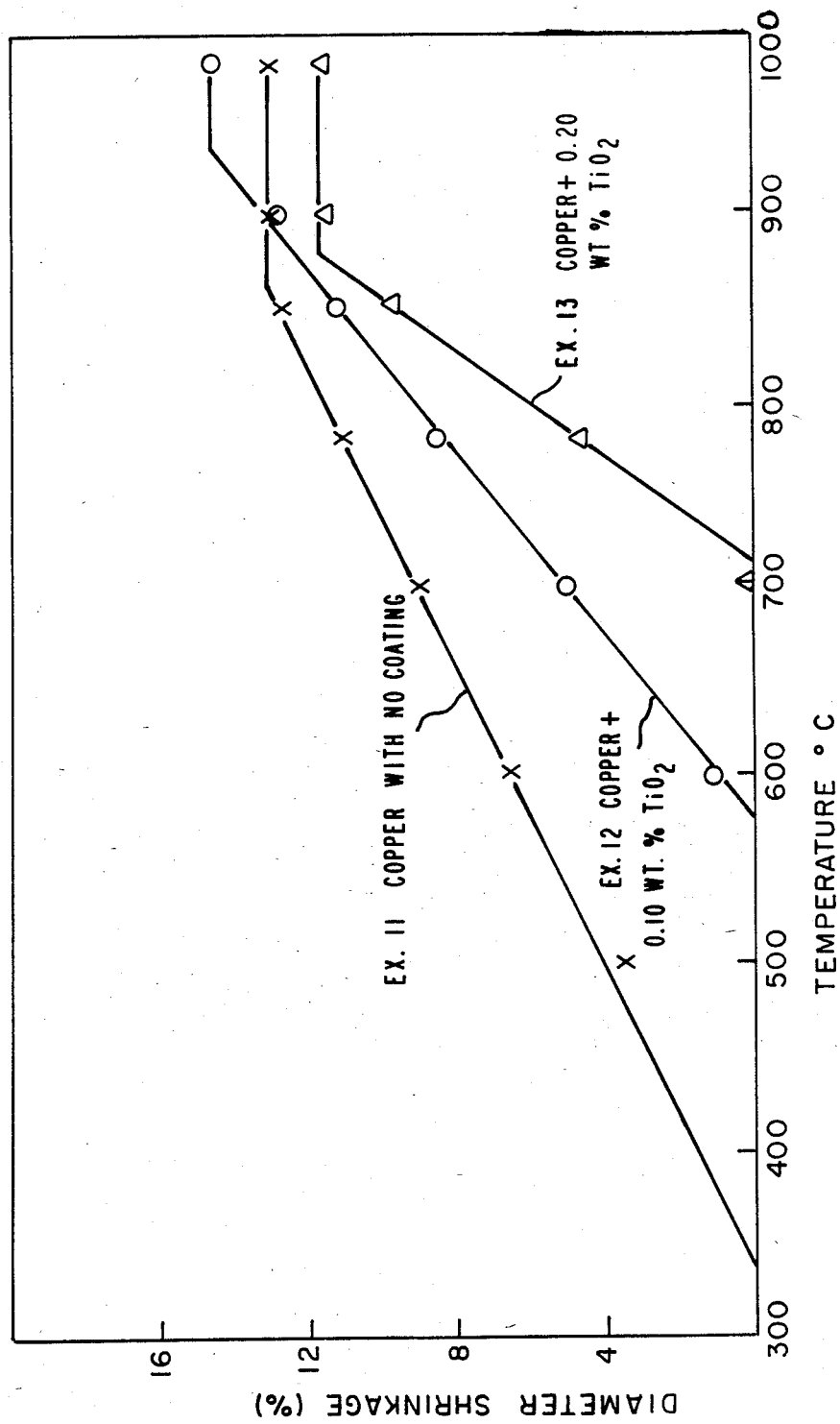

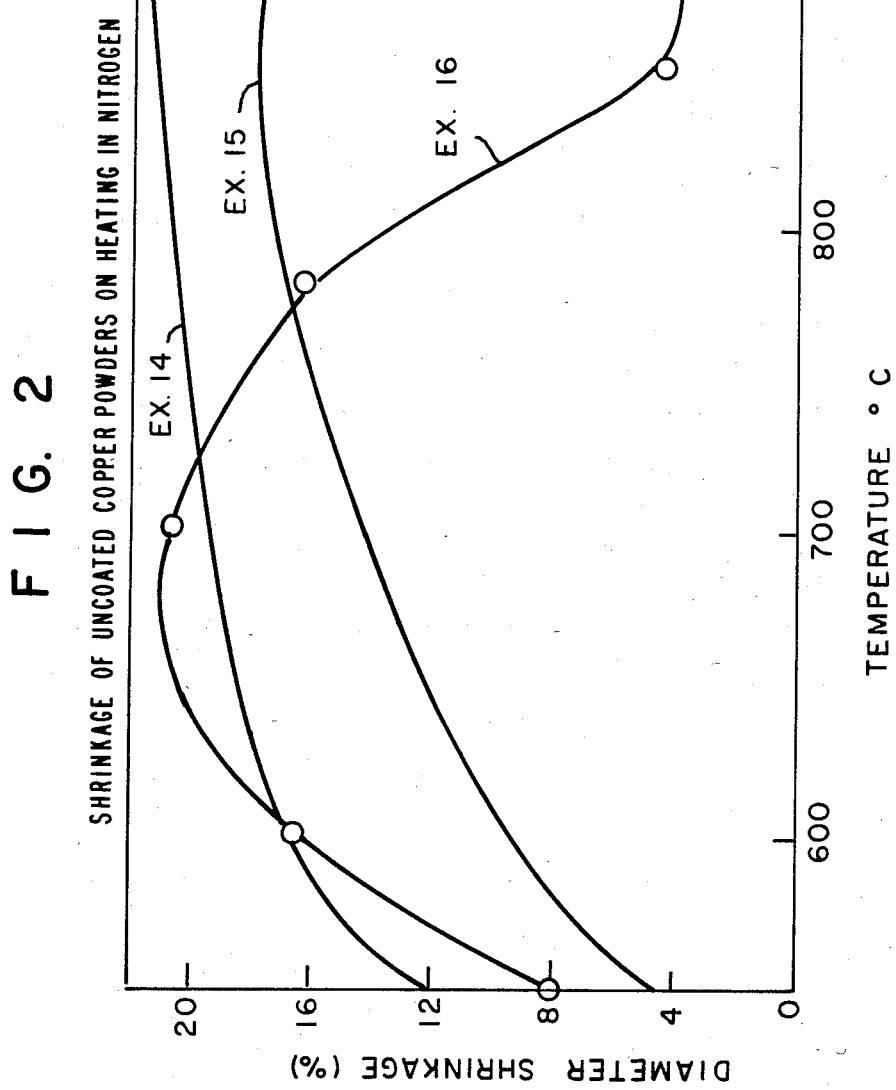

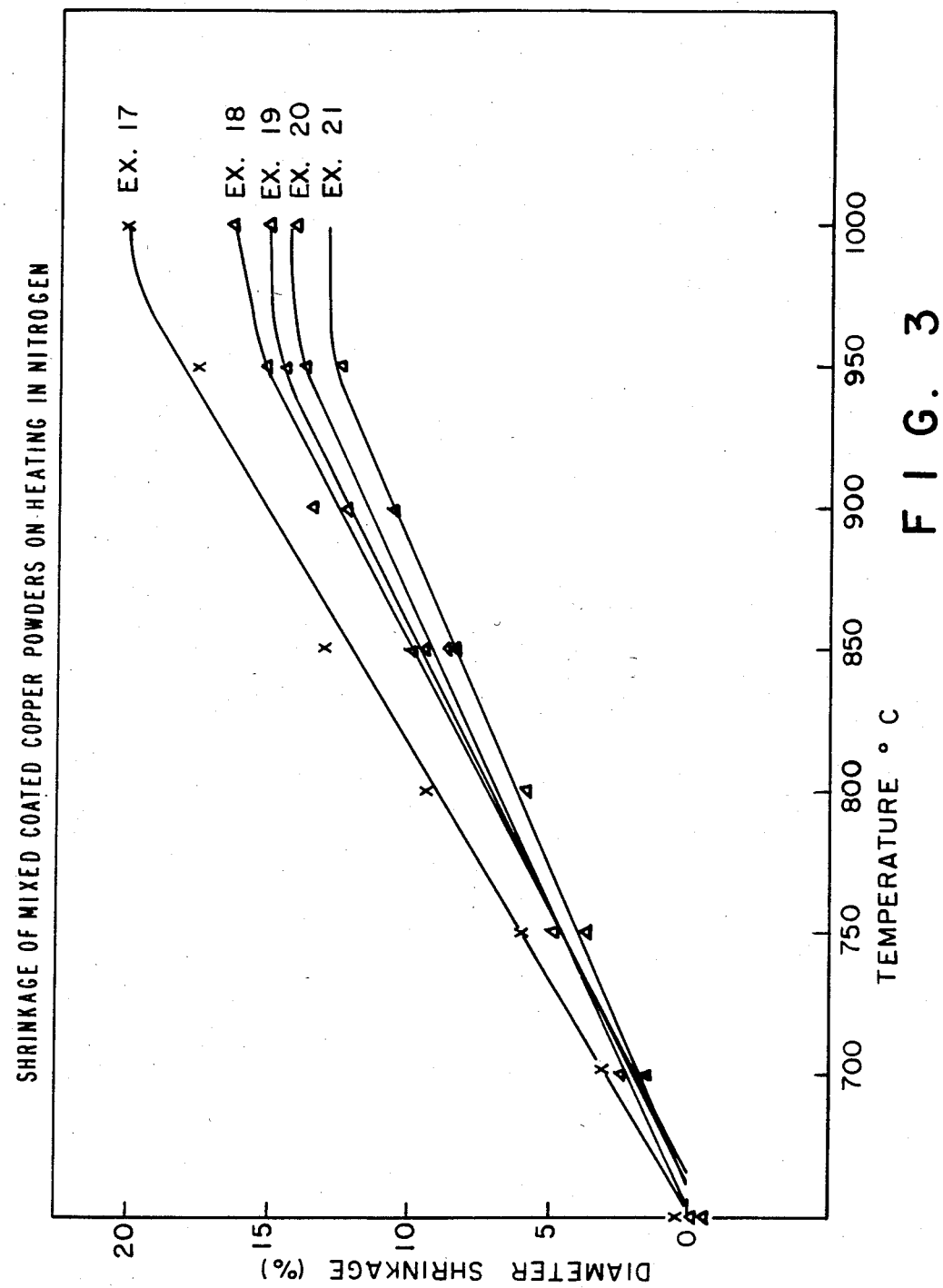

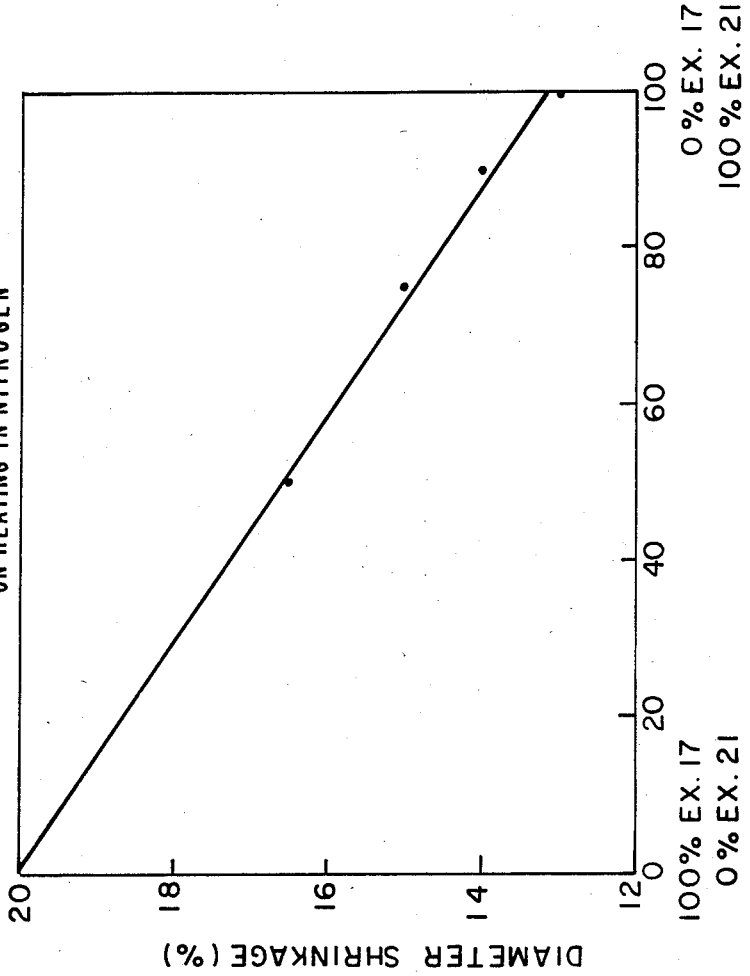

METAL OXIDE-COATED COPPER POWDER

This is a division of application Ser. No. 651,081, filed Sept. 17, 1984.

The invention relates to metal oxide-coated copper metal powders which are especially suitable for conductors in multilayers.

BACKGROUND OF THE INVENTION

The term "hybrid microcircuit" refers to the interconnection and packaging of discrete electronic devices in a thick film or thin film network. In the past, the interconnections have been made by building a circuit or a number of circuits on a ceramic substrate. Recently multilayers of this type have been made by printing alternating layers of copper thick film conductor materials and dielectric materials in a desired configuration on a rigid ceramic substrate such as alumina. Each of the dielectric layers is fired in a nonoxidizing atmosphere to effect densification of the dielectric material without oxidizing the copper conductive material before the next layer is applied. Because the substrate prevents lateral shrinkage, the finished multilayer structure remains flat. Therefore, the thermal coefficient of expansion (TCE) of the thick film conductor and dielectric materials need only approximate the TCE of the substrate in order to obtain relatively flat multilayer structures.

Though the use of thick film pastes is technically adequate, equally satisfactory multilayer structures can be obtained much more economically by the use of the "green tape" method.

This process involves the use of a tape fabricated from 92-94% wt. purity $Al_2O_3$ ceramic powder and a flexible polymeric binder, one or more layers of which are metallized with a patterned conductive layer, including punched vias, stacked and then laminated with heat and pressure. After lamination, the multilayer assemblage is cofired in a reducing atmosphere to produce the completed multilayer. As many as forty such alternating layers are used to form high density interconnections for use in various electronic hardware such as computer logic modules.

Since $Al_2O_3$ is refractory, the conductor metals must be correspondingly refractory. In the past, W, Mo and Mo/Mn have been used as the conductive layer material for metallic traces and via interconnects. Particularly widely used for multilayers has been the system $Al_2O_3$/Mo-Mn. Despite its advantages, the use of the $Al_2O_3$/Mo-Mn system has several disadvantages. For example, the conductivity of Mo-Mn is too low for modern high speed data processing equipment. Also, $Al_2O_3$/Mo-Mn requires firing temperatures on the order of 1500° C. in a wet $H_2$ atmosphere to achieve proper densification of the $Al_2O_3$. Furthermore, $Al_2O_3$ has a temperature coefficient of expansion (TCE) which is twice that of Si. Therefore, large integrated circuit chips often crack when they are bonded to the multilayer substrate because of the mismatch in TCE between $Al_2O_3$ and Si. To overcome these problems, Herron et al. in U.S. Pat. No. 4,234,367 and Kymar et al. in U.S. Pat. No. 4,301,324 have proposed the use of green tape in which the $Al_2O_3$ is replaced by a glass ceramic having a low crystallization temperature and Mo-Mn is replaced by Cu as the conductive layer material.

Suitable glasses are disclosed to the β-spodumene ($Li_2O \cdot Al_2O_3 \cdot 4SiO_2$) and cordierite ($2MgO \cdot 2Al_2O_3 \cdot 5SiO_2$). Both the spodumene and cordierite sinter below 1000° C.

Using the above-referred materials in the green tape process, the multiple layers are cofired 3-5 hours at 775±10° C. in a steam/$H_2$ atmosphere to burn out the polymeric binder, after which the $H_2/H_2O$ atmosphere is replaced by $N_2$ and firing is completed at 930°-970° C. to achieve densification of the glass ceramic material. Because of the high sintering temperature, the structure shrinks about 15% and glass ceramic material is crystallized into cordierite ceramic.

In the above-described system, the fine copper powder begins to sinter and shrink when it reaches 400° C. in the firing cycle, whereas the glass ceramic material does not sinter until it reaches 780° C. Because of this difference in the sintering and shrinking characteristics of the two materials, the multilayer tends to incur warping and bowing. For this reason, it has been difficult to produce cordierite/copper multilayer structures with the required degree of flatness. Thus, it would be very desirable to have a copper-based conductive material which would not incur sintering until it reached about 780° C. and which would also have predictable shrinkage characteristics approaching those of green glass ceramic tape, i.e. about 15% shrinkage occurring between 700° and 970° C.

A still further problem with the prior art copper powders has been the unpredictability of the copper powders from batch to batch. This is illustrated in Wolf, J. ed., *Powder Metallurgy*, Am. Soc. for Metals, Cleveland, OH (1942). In Chapter 31 (pages 323-331) of this publication, J. E. Drapeau, Jr. presents several sintering curves for copper powders under various sintering conditions which are so diverse in shape that it would be extremely difficult if not impossible to predict the sintering characteristics of mixtures of such materials under other sintering conditions or in blends with other copper materials. Thus the availability of copper materials having not only improved but also predictable shrinkage characteristics is an important goal.

BRIEF DESCRIPTION OF THE INVENTION

The invention is therefore directed in its primary aspect to particles of Cu-containing metal having sintering and shrinkage characteristics which more closely match those of green ceramic tape, bearing a thin, substantially continuous coating of at least one metal oxide having a free energy of formation more negative than −98 kcal/mole and having a particle size of 0.5-20 μm in largest dimension.

In a secondary aspect, the invention is directed to a method for changing the shrinkage characteristics and raising the sintering temperature of finely divided Cu-containing metal particles comprising the sequential steps of:

(a) dispersing the Cu-containing metal particles in a solution comprising (1) an organometallic compound of a metal, the oxide of which has a free energy of formation more negative than −98 kcal/mole dissolved in (2) a volatile organic solvent, (b) while maintaining the dispersion by agitation, removing the solvent by evaporation, thus forming a coating of the organometallic compound on the Cu-containing metal particles, and (c) treating the organometallic compound-coated Cu-containing metal particles in a reducing atmosphere at an elevated temperature and for a time sufficient to effect reduction of any copper oxide on the copper-containing metal particles and decomposition of the organometallic compound to the corresponding metal oxide.

In a third aspect, the invention is directed to printable thick film pastes comprising a dispersion of the above-described metal oxide-coated Cu-containing metal particles in organic medium.

BRIEF DESCRIPTION OF THE DRAWINGS

The drawings consist of FIGS. 1-4. FIGS. 1-3 are graphical representations of the effect of temperature upon the shrinkage of metal oxide-coated and uncoated copper particles, and FIG. 4 is a blending curve for coated copper particles.

PRIOR ART

Copper-containing thick film conductor compositions are, of course, well known in the art. They have, in fact, been formulated in a number of different ways for a wide variety of applications. For example, U.S. Pat. No. 2,993,815 to Treptow is directed to a method of forming a copper conductive layer for printed circuits on a refractory substrate by screen printing a layer of 5-50 parts by weight copper or copper oxide and 1 part by weight of reduction-resistant glass frit dispersed in an organic medium. The conductive layer is formed by firing the applied paste in two stages at 500°-1050° C. In the first firing stage, the glass is partially sintered in an oxidizing atmosphere and, in the second stage, the glass is completely sintered in a reducing atmosphere.

Bolon et al., U.S. Pat. No. 3,988,647, disclose a conductor composition comprising Cu particles which have been treated to remove oxide from the surface dispersed in a solventless polymeric binder. This patent is concerned only with oxide-free Cu powders and the conductive composition of this reference contains quite high polymer concentrations.

The Grier patent, U.S. Pat. No. 4,072,771 is directed to a conductor composition comprising Cu particles, which have been preoxidized to form a surface layer of CuO, and glass frit dispersed in 15-25%, wt, organic medium. The oxide coating of the Cu particles constitutes 1-5% by wt. of the total solids (Cu oxide and glass). The patent is silent with respect to the use of oxides other than CuO.

Applicant's copending U.S. patent application, Ser. No. 505,730, filed June 20, 1983, is directed to thick film copper conductor compositions for use with Ru-based resistors in which the copper particles are coated with a thin layer of copper oxide to promote sintering of the copper particles at very low firing temperatures in a nonoxidizing atmosphere and to obtain good substrate adhesion and solderability.

Applicant's copending U.S. patent application, Ser. No. 526,400, filed Aug. 26, 1983, is directed to thick film copper conductor compositions for use with resistors or dielectrics, which are less susceptible to oxidation during firing in nonoxidizing conditions, comprising a conductive metal which is at least 28% copper, inorganic binder and a small amount of a noncuprous metal such as W, Mo, Re and alloys and mixtures thereof.

In addition, unexamined Japanese Patent Application 57-71115 (published May 5, 1982) discloses an electrode paste comprising a dispersion of noble metal powder and organometallic powder dispersed in an organic medium. When firing the paste in air, the organometallic compound forms very fine particles of corresponding metal oxides which are dispersed among the metal powder particles and are alleged to suppress growth of the metal particles.

DETAILED DESCRIPTION OF THE INVENTION

A wide variety of organometallic compounds can be used in the invention to coat the copper-containing particles so long as the oxide(s) of the metallic moiety thereof has a free energy of formation per gram atom of oxygen more negative than −98 kcal/mole. Therefore, the oxides of Si, Ti, Ce, Zr, Al, Ba, Li, Sr, La, Mg, Ca, V, Ta and mixtures thereof are all suitable.

The composition of the organometallic compound is not, strictly speaking, critical except to the extent that the compound must (1) be completely soluble in organic solvent, (2) contain an oxygen-metal linkage, and (3) be readily pyrolyzable in a nonoxidizing or reducing atmosphere.

The role of the organometallic compound can be characterized in a generalized way as follows:

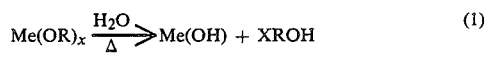
(1)

(2)

Suitable organometallic compounds includes hydrocarbyl metallates of the formula Me(OR)X and metal chelates such as those having the following structural formula:

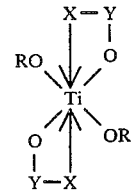

wherein X is a functional group containing oxygen or nitrogen and Y is $C_{2\text{-}3}$ alkyl.

Titanium compounds of these two classes are quite readily available in commercial quantities and include such compounds as the following:
Tetraisopropyl titanate
Tetra-n-butyl titanate
Tetrakis(2-ethylhexyl)titanate
Lactic acid titanium chelate
Titanium acetylacetonate
Triethanolamine titanium chelate
Titanium ethyl acetoacetonate chelate Though the titanium organometallic compounds are most available, nevertheless similar and analogous compounds exist for the other metals which are suitable for the invention. Among those are aluminum diisopropoxide acetate ester and tetraethoxy silane. Many others will be apparent to those skilled in the art of organometallic materials.

The organometallic compound, which is a precursor of the desired metal oxide, is deposited on the copper powder by dispersing the copper particles in a solution of the organometallic compound in an anhydrous volatile organic solvent. Suitable alcoholic solvents include methanol, ethanol, isopropanol and methyl ethyl ketone. Methylene chloride can also be used. By evaporating the solvent from the dispersion in a flash evaporator, the copper particles become coated with a thin layer of the organometallic compound. By increasing the concentration of organometallic compound in the coating solution, the coating thickness can be increased accordingly. Consequently, the oxide coating is correspondingly changed.

The resultant oxide layer is in most instances on the order of 10–200 Å in thickness and substantially continuous in nature. It is not, however, necessary that the coating be wholly continuous. Nevertheless, the extent of the coating must be such as to preclude any significant degree of metal-to-metal contact among the oxide-coated particles. Though thicker coatings tend to give more nearly complete particle coverage, the thickness of the oxide layer should not exceed about 1000 Å in order to avoid substrate adhesion problems. Such layers are at most only about 100 atomic layers in thickness and therefore do not significantly change the diameter of the copper particles.

With respect to particle configuration, both particle size and particle shape are very important. To attain suitable sintering properties, it is essential that the copper-containing particles fall within the range of 0.5–20 $\mu$m and that the average particle size be 1–5 $\mu$m. When the copper-containing particles are less than about 0.5 $\mu$m, the surface are of the particles becomes too high, which necessitates the use of excessive amounts of organic medium to obtain suitable printing viscosities. Furthermore, swelling and blistering of the printed Cu layer occurs when it is fired because it is very difficult to burn out high amounts of organic medium. On the other hand, when the size of the copper-containing particles is more than about 20 $\mu$m, the particles do not sinter adequately at low firing temperatures and therefore the conductor layer is porous, does not adhere adequately and has low conductivity. Such coarse particles also exhibit poor printing characteristics. For these same reasons, it is also necessary that, within these broad limits of acceptable particle size, the average particle size should be 1–5 $\mu$m. An average copper-containing particle size of 2–4 $\mu$m is preferred to attain even better properties in the fired film.

It is also important that the copper-containing particles used in the invention have a substantial degree of sphericity. That is, they much have a surface area-to-weight ratio of below about 1.0 m$^2$/g. A ratio of 0.8 m$^2$/g or lower is preferred and 0.2–0.5 m$^2$/g is an especially preferred practical minimum range. The minimum possible surface-to-weight ratio for 2 $\mu$m size particles would be about 0.30 m$^2$/g for perfect spheres. For 4 $\mu$m size spherical particles, the minimum possible surface area-to-weight ratio would be about 0.15 m$^2$/g. However, as a practical matter, such perfect spheres are not obtainable.

An important advantage of the invention is its use in making available Cu-containing particles which will have predictable shrinkage characteristics in practical applications. As is shown by Examples 11–21, selected shrinkage characteristics can be achieved by blending oxide-coated particles having different shrinkages. Thus, in some instances, it will become desirable to blend oxide-coated particles having higher shrinkage, e.g., 20%, with oxide-coated particles having lower shrinkage, e.g., 13%, to obtain predictably intermediate values. For this reason, it may be desirable to adjust upward the degree of shrinkage of Cu-containing particles made in accordance with the invention. Quite surprisingly, it has been found that the shrinkage of particles treated in accordance with the invention can be increased by mildly milling the particles. This effects a limited amount of particle flattening without substantially changing the surface area-to-weight ratio of the particles. This operation can be carried out during the oxide coating step [Step (b)] or afterward. It is, however, preferred to carry out this additional operation during the oxide coating step. It should be recognized, however, that this mild milling step does not produce flake particles but merely more elliptical and truncated particles. Bead milling is frequently used for this purpose and is preferred.

Even though the foregoing discussion has been presented with emphasis on the use of copper alone, it will be recognized that the invention is also useful for copper alloys having similarly high electrical conductivity. Included among such alloys are Cu/Cd, Cu/Zr, Cu/Ti and Cu/Cr. Suitable alloys of this type are disclosed in Dummer, *Metals for Conductive and Resistive Functions,* Hayden Book Co., Inc., New York, NY, 1970, pp. 21–27.

In the Examples which follow, metal oxide-coated Cu particles were made by the following procedure:

(1) the organometallic compound is dissolved in an excess of an alcoholic solvent (methanol). The solution volume is chosen to be about three times the volume of copper powder to be added;

(2) copper powder is added to the solution of step (1) and the mixture is agitated to disperse the copper powder;

(3) the dispersion of step (2) is continuously agitated and heated to 40° C. in a rotary evaporator to remove the alcoholic solvent and leave a coating or organometallic compound on the surface of the Cu particles;

(4) the coated Cu particles from step (3) are heated to 220°–250° C. and treated with a reducing atmosphere (e.g. 4% H$_2$/96% N$_2$ forming gas) for a time sufficient to decompose the organometallic compound and reduce substantially all of the metal oxide formed therefrom (reducible oxides below 0.1% basis Cu). Any high boiling decomposition products from the organometallic are also volatilized in this step.

Shrinkage was determined by pressing 3 grams of Cu powder at 3000 psi (211 kg/cm$^2$) in a 0.5 inch (1.27 cm) die. Copper pellets thusly formed were then heated for one hour in an N$_2$ atmosphere to the indicated elevated temperatures. Shrinkage was calculated as the percent change in pellet diameter from measurements made before and after sintering.

EXAMPLES 1–10

Using the above-described procedure, a series of ten metal oxide-coated copper powders was prepared and the sintering and shrinkage characteristics of each were observed and compared with uncoated copper particles. The beginning sintering temperature of each of the powders was raised from 350° C. to at least 600° C. (Examples 7 and 9). Moreover, beginning sintering temperatures of 780° C. were obtained with Examples 4–6 and 10, while Example 2 coated powders did not begin to sinter until they were heated above 900° C. With the exception of Example 6 all of the oxide-coated Cu powders exhibited total shrinkage values about the same as the uncoated copper particles. The composition and properties of the members of this series are given in Table 1 which follows:

TABLE 1
EFFECT OF OXIDE COATING ON SINTERING OF COPPER POWDERS

| Example No. | Organometallic Composition | Compound g/100 g Cu | Metal Composition | % Wt. |
|---|---|---|---|---|
| 1 | (1) | 0.67 | Ti | 0.094 |
| 2 | (2) | 1.07 | Al | 0.104 |
| 3 | (3) | 1.00 | Si | 0.135 |
| 4 | (4) | 2.00 | Ti | 0.154 |
| 5 | (4) | 2.00 | Ti | 0.154 |
| 6 | (4) | 2.00 | Ti | 0.154 |
| 7 | (1) | 0.42 | Ti | 0.059 |
| 8 | (1) | 0.83 | Ti | 0.118 |
| 9 | (1) | 0.67 | Ti | 0.094 |
| 10 | (5) | 0.95 | Ti | 0.094 |
| Control | — | None | — | None |

| Example No. | Metal Oxide Composition | % Wt. | Sintering Temperature (°C.) Begin | Sintering Temperature (°C.) End | Shrinkage (%) |
|---|---|---|---|---|---|
| 1 | $TiO_2$ | 0.15 | 780 | 980 | 14 |
| 2 | $Al_2O_3$ | 0.20 | >900 | — | — |
| 3 | $SiO_2$ | 0.24 | 600 | 900 | 15 |
| 4 | $TiO_2$ | 0.26 | 780 | >980 | — |
| 5 | $TiO_2$ | 0.26 | 780 | 950 | 15 |
| 6 | $TiO_2$ | 0.26 | 780 | 850 | 20 |
| 7 | $TiO_2$ | 0.10 | 600 | 900 | 12 |
| 8 | $TiO_2$ | 0.20 | 700 | 880 | 12 |
| 9 | $TiO_2$ | 0.15 | 600 | 920 | 15 |
| 10 | $TiO_2$ | 0.15 | 780 | 980 | 14 |
| Control | — | None | 350 | 850 | 14 |

(1) Tetra-n-butyl titanate
(2) Aluminum diisopropoxide acetate ester
(3) Tetraethoxy silane
(4) Tetraoctylene glycol titanate
(5) Acetylacetonate chelate of Ti

EXAMPLES 11-13

Using the above-described uncoated copper powder, two batches of titanium dioxide-coated copper powders were prepared and the shrinkage characteristics were observed and compared with like uncoated copper particles. The data in FIG. 1 show that the extent of the shrinkage upon heating is substantially delayed upon heating to 600°-700° C. when the copper particles are coated with metal oxide. Moreover, the extent of shrinkage is related directly and linearly to the sintering temperature. The linearity of the shrinkage is, of course, quite important with regard to the predictability of the shrinkage performance of these materials.

EXAMPLES 14-16

For comparison, the shrinkage characteristic of a series of three uncoated copper powders was observed in which the average particle size was lower than in Examples 11-14 and the surface area was higher than those of the invention (1.0 m²g). FIG. 2 shows that the variation of shrinkage with temperature was quite diversely curvilinear and therefore unpredictable as a practical matter. Thus, unlike the materials of Examples 11-13, the use of these materials would be very difficult when it is desired to obtain a preselected shrinkage behavior.

EXAMPLES 17-21

To illustrate the important predictability of the oxide-coated copper particles of the invention, a series of five compositions was prepared in which quantities of two $TiO_2$-coated copper powders having shrinkages of 20% (Example 17) and 13% (Example 21) at 1000° C. were blended and the shrinkage of the blends was measured up to 1000° C. These data are given in FIG. 3 and show that the shrinkage curves for each of the mixtures was approximately linear at least up to 950° C. Moreover, when the shrinkage at 1000° C. is plotted as a function of the weight % of Example 17 and Example 21 coated copper materials in the mixtures, the resultant blending curve was almost exactly linear (FIG. 4).

I claim:
1. Particles of Cu-containing metal having sintering and shrinkage characteristics which more closely match those of green ceramic tape, bearing a substantially continuous coating of at least one metal oxide having a free energy of formation more negative than −98 kcal/mole and having a particle size of 0.5-20 μm in largest dimension and a surface area less than 1.0 m²/g.
2. The coated particles of claim 1 on which the coating is an oxide of a metal selected from the group consisting of Si, Ti, Ce, Zr, Al, Ba, Sr, La, Mg, Ca, V, Ta and mixtures thereof.
3. The coating particles of claim 1 in which the Cu-containing metal is selected from the group consisting of Cu, Cu/Cd, Cu/Zr, Cu/Ti, Cu/Cr and mixtures thereof.
4. The coated particles of claim 1 in which the Cu-containing metal is Cu.
5. A method for more closely matching the shrinkage of green ceramic tape and raising and sintering temperature of finely divided Cu-containing metal particles comprising the sequential steps of:
  (a) dispersing the Cu metal particles in a solution comprising (1) an organometallic compound of a metal, the oxide of which has a free energy of formation more negative than −98 kcal/mole dissolved in (2) a volatile organic solvent,
  (b) while maintaining the dispersion by agitation, removing the solvent by evaporation, thus forming a coating of the organometallic compound on the Cu-containing metal particles, and
  (c) treating the organometallic compound-coating Cu metal particles in a reducing atmosphere at an elevated temperature and for a time sufficient to effect reduction of any copper oxide on the copper metal particles and decomposition of the organometallic compound to the corresponding metal oxide.
6. A method for increasing the shrinkage of copper powders comprising the method of claim 5 in which the oxide-coated Cu-containing metal particles are mildly milled to effect flattening of the particles without substantially changing the surface area-to-weight ratio of the particles.
7. The method of claim 6 in which milling of the particles is carried out during steps (a) and (b).

* * * * *